US006441390B2

(12) United States Patent
Sato et al.

(10) Patent No.: US 6,441,390 B2
(45) Date of Patent: Aug. 27, 2002

(54) ELECTRON DISCHARGING APPARATUS

(75) Inventors: Junichi Sato, Tokyo; Nobuyuki Saotome, Kanagawa, both of (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/753,559

(22) Filed: Jan. 4, 2001

(30) Foreign Application Priority Data

Jan. 6, 2000 (JP) ....................................... 2000-000565

(51) Int. Cl.[7] ................................................ H01L 29/06
(52) U.S. Cl. ......................................................... 257/10
(58) Field of Search ............................ 257/10, 11, 213, 257/488, 618, 622, 773

(56) References Cited

U.S. PATENT DOCUMENTS

| | | | | |
|---|---|---|---|---|
| 4,303,930 A | * 12/1981 | Van Gorkom et al. | ........ | 357/13 |
| 4,574,216 A | * 3/1986 | Hoeberechts et al. | ....... | 313/444 |
| 4,906,894 A | * 3/1990 | Miyawaki et al. | .......... | 313/542 |
| 4,939,588 A | 7/1990 | Ushiro | ....................... | 358/401 |

FOREIGN PATENT DOCUMENTS

| | | |
|---|---|---|
| JP | 56-15529 | 2/1981 |
| JP | 64-45694 | 2/1989 |

* cited by examiner

*Primary Examiner*—Hoai Ho
*Assistant Examiner*—Quoc Hoang
(74) *Attorney, Agent, or Firm*—Rader, Fishman & Grauer PLLC; Ronald P. Kananen, Esq.

(57) ABSTRACT

Disclosed is an electron discharging apparatus capable of fully accelerating electrons emitted from an electron discharging portion consisting of a pn-junction by effect of securing a greater exposure area of an accelerating electrode against said electron discharging portion. The inventive electron discharging apparatus comprises; a pn-junction formed on a surface side of a semiconductor substrate; an insulating film formed on the semiconductor substrate; a first aperture portion formed through a first insulating film formed on the pn-junction; and an accelerating electrode which is formed on the first insulating film by way of surrounding periphery of the first aperture portion. The accelerating electrode is formed so that inner edge portion of the accelerating electrode is projected into the first aperture portion area.

5 Claims, 12 Drawing Sheets

ELECTRON DISCHARGING APPARATUS

BACKGROUND OF THE INVENTION

1. Field of the Invention

The present invention relates to an electron discharging apparatus and a method of manufacturing the apparatus. More particularly, the present invention relates to an electron discharging apparatus which may be employed for a display apparatus or an image-pickup apparatus, and, also applicable to such an electron beam exposure apparatus and an electron microscope as well.

2. Description of the Related Art

As was disclosed in the U.S. Pat. No. 4,303,930 (based on the Japanese Patent Laid-Open Publication No. SHOWA-56-15529/1981 and the other Japanese Patent Laid-Open Publication No. HEISEI-1-45694/1989) for example, in such a semiconductor apparatus substantially constituting a cold cathode, inverse-directional bias is applied so that avalanche multiplication of charged carrier can be attained. In this case, a certain electron can gain a thermal energy exceeding work function of electrons. In such a semiconductor apparatus, discharge of these electrons is easily executed by way of providing an accelerating electrode or a gate electrode on an insulating film formed on the main surface of the semiconductor apparatus. An aperture portion is formed at a position of an electron-discharging area of this insulating film. Discharge of electrons is more easily executed by providing a certain material capable of lowering work function of electrons on the surface of a semiconductor apparatus at the position of the electron discharging area.

Referring to a schematic cross-sectional view shown in FIG. 9, an example of a conventional electron discharging apparatus is described below.

As shown in FIG. 9, a conventional semiconductor substrate 110 is formed with a p+ type silicon substrate 111 and a p-type epitaxial layer 112 formed thereon. A p+ area 113 is formed in the p-type epitaxial layer 112, and, an n++ area 114 is formed on an upper layer whereby forming a pn-junction 115. Further, an n+ area 116 linked with the n++ area 114 is formed on an upper layer of the p-type epitaxial layer 112. An insulating film 121 is formed on the above-referred semiconductor substrate 110, and, an accelerating electrode 131 is formed on the insulating film 121. Further, an insulating film 141 is formed by covering the accelerating electrode 131.

Further, a connecting hole 122 connecting to the n+ area 113 is formed through the insulating film 121. An extraction electrode 132 connecting to the n+ area via the connecting hole 122 is formed. Further, another connecting hole 142 connecting to the accelerating electrode 131 is formed through the insulating film 141. Further, another extraction electrode 132 connecting to the accelerating electrode 131 is formed through the insulating film 141, and another extraction electrode 133 connecting to the accelerating electrode 131 is formed through the connecting hole 142. Further, a protecting film 143 is formed by covering the accelerating electrode 131 and the extraction electrodes 132 and 133.

Further, an aperture portion 125 for discharging electrons is formed through the protection film 143, the insulating film 141, the accelerating electrode 131, and the insulating film 121. Further, another aperture portion 144 for wire-bonding is formed through the protecting film 143 on the extraction electrode 133.

SUMMARY OF THE INVENTION

In order to maximize function of an electronic tube with emitted electrons by applying a voltage to the accelerating electrode utilized for a conventional electron discharging apparatus, structural relationship between an electron discharging surface and the accelerating electrode must be considered. However, in a conventional electron discharging apparatus based on a cold cathode structure, a pn-junction being the basis of the cold cathode structure is formed on a surface of a silicon substrate and an insulating film is formed on the pn-junction with using a planer process. Accordingly, there is such a critical problem that electrons can not fully be accelerated because of a remote distance between the electron discharging portion and the accelerating electrode. Further, in such a conventional electron discharging apparatus based on the conventional cold cathode structure, structurally, because of insufficient exposed area size of the accelerating electrode with respect to the electron discharging portion consisting of a pn-junction, acceleration of the discharged electrons may not be fully accomplished.

In order to fully solve the above problems, the present invention provides a novel electron discharging apparatus and a method of manufacturing the electron discharging apparatus.

A first electron discharging apparatus according to the present invention comprises the following:

- a pn-junction formed on the part of the surface of a semiconductor substrate;
- an insulating film formed on said semiconductor substrate;
- an aperture portion formed through said insulation film on said pn-junction; and
- an accelerating electrode formed on said insulating film so as to surround the periphery of said aperture portion;

wherein said accelerating electrode is formed so as to project its inner edge portion into said aperture portion. In the first electron discharging apparatus according to the present invention, inasmuch as the above-referred accelerating electrode is formed by way of projecting its inner edge portion into the aperture portion area, a lateral surface and the bottom surface of the accelerating electrode facing the aperture portion respectively extended into the aperture portion area. Accordingly, the accelerating electrode is provided with a greater exposure area with respect to an electron discharging portion consisting of a pn-junction than that of such an accelerating electrode provided for any of conventional electron discharging apparatuses. Because of this, electrons discharged from the pn-junction are fully accelerated.

A second electron discharging apparatus according to the present invention comprises the following:

- a pn-junction formed on the part of the surface of a semiconductor apparatus;
- an insulating film formed on said semiconductor substrate;
- an aperture portion formed through said insulation film on said pn-junction;
- and an accelerating electrode formed on said insulating film so as to surround the periphery of said aperture portion;

wherein said accelerating electrode is formed into a substantially L-shaped configuration at a cross-sectional plane.

In the second electron discharging apparatus according to the present invention, inasmuch as the above-referred accelerating electrode is formed into a substantially L-shaped configuration at a cross-sectional plane, the substantially L-shaped vertical-wall portion of the accelerating electrode is formed facing the aperture portion area, and thus, exposure area of the accelerating electrode against an electron discharging portion consisting of a pn-junction becomes greater than that of such an accelerating electrode provided for any of conventional electron discharging apparatuses. Because of this, electrons discharged from the electron discharging portion consisting of a pn-junction are fully accelerated.

A third electron discharging apparatus according to the present invention comprises the following:

a pn-junction formed on the part of the front surface of a semiconductor substrate;

an insulating film formed on said semiconductor substrate;

an aperture formed through said insulating film on said pn-junction; and an accelerating electrode formed on said insulating film so as to surround the periphery of said aperture portion;

wherein said accelerating electrode is formed into a substantially inverse L-shaped configuration at a cross-sectional plane.

In the third electron discharging apparatus according to the present invention, inasmuch as the accelerating electrode is formed into a substantially inverse L-shaped configuration, the accelerating electrode is provided with a greater exposure area with respect to an electron discharging portion consisting of a pn-junction than that of such an accelerating electrode provided for any of conventional electron discharging apparatuses. Because of this, electrons discharged from the electron discharging portion consisting of a pn-junction are fully accelerated.

A first method for manufacturing an electron discharging apparatus according to the present invention comprises the following steps:

a step of forming a pn-junction on the part of the surface of a semiconductor substrate;

a step of forming an insulating film on said semiconductor substrate;

a step of forming an aperture portion through said insulation film on said pn-junction; and a step of forming an accelerating electrode on said insulating film so as to surround said aperture portion; wherein said method further comprises a step of removing said insulating film facing said aperture portion below said accelerating electrode so as to dispose said accelerating electrode into the state where inner edge portion of the accelerating electrode is projecting into said aperture portion area.

Inasmuch as the above-referred first method comprises a step of removing said insulating film facing an aperture portion below the accelerating electrode so as to dispose the accelerating electrode into the state projecting itself into said aperture portion, a lateral surface and the bottom surface of the accelerating electrode facing the aperture portion respectively extend themselves against the aperture portion area. Accordingly, the accelerating electrode is so formed that an exposure area with respect to an electron discharging portion consisting of a pn-junction becomes greater than that of such an accelerating electrode provided for any of conventional electron discharging apparatuses. Because of this, the inventive accelerating electrode enables electrons discharged from the pn-junction to be accelerated to full extent.

A second method for manufacturing an electron discharging apparatus according to the present invention comprises the following steps:

a step of forming a pn-junction on the part of the surface of a semiconductor substrate;

a step of forming a first insulating film on said semiconductor substrate;

a step of forming an electrode film for forming an accelerating electrode on said first insulating film;

a step of forming a second insulating film on said electrode film;

a step of patterning said second insulating film and said electrode film;

a step of removing said second insulating film and said electrode film on said pn-junction to form an aperture portion through both films;

a step of forming a side-wall electrode on lateral wall of said aperture portion to enable said side-wall electrode to be connected to said electrode film;

a step of forming an accelerating electrode by utilizing said electrode film and said side-wall electrode; and a step of extending said aperture portion after opening said first insulating film formed on said pn-junction.

By executing the above-referred second manufacturing method, inasmuch as a side-wall electrode to be connected to an electrode film is formed on a lateral wall of an aperture portion and then an accelerating electrode is formed by applying an electrode film and said side-wall electrode, the accelerating electrode is formed into a substantially L-shaped configuration. And yet, inasmuch as the side-wall electrode corresponding to the vertical wall portion of the substantially L-shaped accelerating electrode faces the aperture-portion side, the accelerating electrode is provided with a greater exposure area than that of such an accelerating electrode provided for any of conventional electron discharging apparatuses. Because of this, the formed accelerating electrode enables electrons discharged from the above-referred pn-junction to be accelerated to full extent.

A third method for manufacturing an electron discharging apparatus according to the present invention comprises the following steps:

a step of forming a pn-junction on the part of the surface of a semiconductor substrate;

a step of forming a first insulating film on said semiconductor substrate;

a step of forming a dummy pattern on said first insulating film above said pn-junction;

a step of forming an electrode film for forming an accelerating electrode by way of covering said first insulating film with said dummy pattern;

a step of forming a leveled insulating film on said electrode film;

a step of etching back said leveled insulating film and selectively removing said electrode film on said dummy pattern;

a step of forming an accelerating electrode by way of patterning said electrode film;

a step of removing said dummy pattern before forming said aperture portion in said accelerating electrode; and a step of opening said first insulating film on said pn-junction before forming said aperture portion via extension thereof.

Inasmuch as the above-referred third method according to the present invention comprises serial steps consisting of a step of forming an electrode film necessary for forming an accelerating electrode by way of covering a dummy pattern, a step of forming a leveled insulating film on said electrode film, a step of etching back the leveled insulating film, and a step of selectively removing the electrode film on said dummy pattern, the electrode film is formed into a substantially L-shaped configuration at a cross-sectional plane. Further, inasmuch as the third method comprises a step of removing a dummy pattern in order to form an aperture portion, vertical-wall portion of the substantially L-shaped accelerating electrode faces the aperture-portion side. Because of this, the accelerating electrode is provided with a greater exposure area against the electron discharging portion consisting of a pn-junction than that of such an accelerating electrode provided for any of conventional electron discharging apparatuses.

A fourth method for manufacturing an electron discharging apparatus according to the present invention comprises the following steps:

a step of forming a pn-junction on the part of the surface of a semiconductor substrate;

a step of forming a first insulating film on said semiconductor substrate;

a step of forming a second insulating film on said first insulating film;

a step of forming an electrode film for forming an accelerating electrode on said second insulating film;

a step of patterning said electrode film and said second insulating film;

a step of removing said electrode film and said second insulating film formed on said pn-junction before forming an aperture portion;

a step of forming a side-wall electrode on a lateral wall of said aperture portion to cause said electrode film to be connected to said side-wall electrode;

a step of forming an accelerating electrode by means of said electrode film and said side-wall electrode;

a step of opening said electrode film formed on said pn-junction; and a step of forming said aperture portion by way of extending itself.

According to the above-referred fourth manufacturing method, a step of forming a side-wall electrode to be connected to an electrode film is formed on a lateral wall of an aperture portion before forming an accelerating electrode by utilizing the electrode film and the side-wall electrode, and thus, the accelerating electrode is formed into a substantially inverse L-shaped configuration at a cross-sectional plane. And yet, inasmuch as the side-wall electrode corresponding to the substantially inverse L-shaped vertical wall portion faces the aperture portion, the accelerating electrode is provided with a greater exposure area against the electron discharging portion consisting of a pn-junction than that of such an accelerating electrode provided for any of conventional electron discharging apparatuses. Because of this, the accelerating electrode enables electrons discharged from the pn-junction to be accelerated to full extent.

DESCRIPTION OF THE PREFERRED EMBODIMENTS

Referring now to a simplified schematic-cross sectional view shown in FIG. 1, an embodiment for realizing the first electron discharging apparatus related to the present invention is described below.

Figure 1:
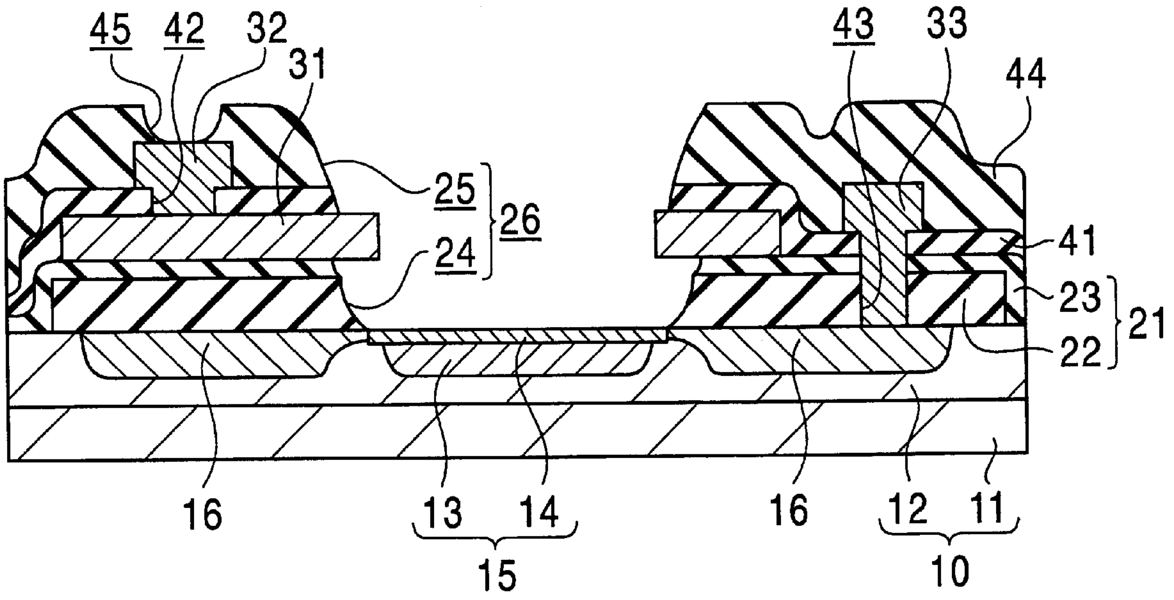
FIG. 1 is a simplified schematic cross-sectional view illustrating an embodiment for realizing the first electron discharging apparatus related to the present invention.

As shown in FIG. 1, a semiconductor substrate 10 is composed of a $P^+$ type silicon substrate 11 and a p-type epitaxial layer 12 formed thereon. A $P^+$ area 13 is formed in the p-type epitaxial layer 12 so as to have a proper density condition and a proper junction depth enabling discharge of electrons with the avalanche effect. An $n^{++}$ area 14 is formed on the $P^+$ area 13 whereby forming a pn junction 15. Further, an $n^+$ area 16 linked with the $n^{++}$ area 14 is formed on the p-type epitaxial layer 12.

An insulating film 21 comprising a first insulating film 22 and a second insulating film 23 is formed on the above-referred semiconductor substrate 10. The first insulating film 22 is composed of a silicon oxide film for example, which is patterned so as to cover the $n^+$ area 16. Further, the second insulating film 23 is composed of a silicon nitride film for example, which is formed on the first insulating film 22 so as to cover the first insulating film 22. A first aperture portion 24 is formed through the insulating film 21 consisting of the first insulating film 22 and the second insulating film 23.

An accelerating electrode 31 made from polycrystalline silicon for example is formed on the insulating film 21 in the periphery of the first aperture portion 24. Further, a third insulating film 41 is formed on the insulating film 21 so as to cover the accelerating electrode 31.

A connecting hole 42 connecting to the accelerating electrode 31 is formed through the third insulating film 41. An extraction electrode 32 made from aluminum for example and connecting to the accelerating electrode 31 is formed inside of the connecting hole 42. Another connecting hole 43 connecting to the $N^+$ area 16 is formed through the third insulating film 41 and the insulating film 21, and, another extraction electrode 33 made from aluminum for example and connecting to the $n^+$ area 16 is formed inside of the connecting hole 43.

Further, a protecting film 44 is formed on the third insulating film 41 so as to cover the extraction electrodes 32 and 33. A second aperture portion 25 connecting to the first aperture portion 24 is formed through the protecting film 44 and the third insulating film 41, thus constituting an aperture 26. Further, another aperture portion 45 connecting to the extraction electrode 32 is formed through the protecting film 44.

The accelerating electrode 31 is formed by way of projecting itself toward the center of the aperture 26. More particularly, the first aperture 24 is formed by over-etching into the bottom side of the accelerating electrode 31, and thus, the accelerating electrode 31 is overhanging in the first aperture 24.

In the first electron discharging apparatus, inasmuch as the accelerating electrode 31 is formed by projecting itself from the aperture 26 (corresponding to the first aperture 24), the lateral surface and the bottom surface of the accelerating electrode 31 on the side of the aperture 26 respectively project themselves against the aperture 26. Accordingly, the accelerating electrode 31 has a greater exposure area against the electron discharging portion consisting of the pn-junction 15 than that of such an accelerating electrode provided for any of conventional electron discharging apparatuses. Because of this, electrons discharged from the pn-junction 15 can be accelerated to full extent.

Referring now to a cross-sectional view shown in FIG. 2, an embodiment for implementing the first method for manufacturing the electron discharging apparatus related to the present invention is described below. In FIG. 2, those components exactly identical to those which are shown in FIG. 1 are respectively designated by identical reference numerals.

Figure 2A:
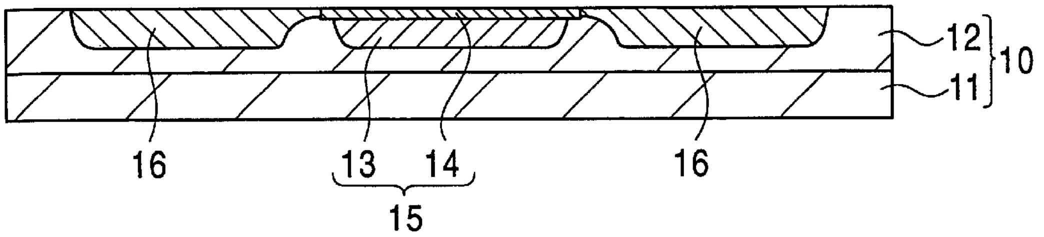
FIGS. 2A–2D are a simplified schematic sectional view illustrating an embodiment for implementing the first method for manufacturing the electron discharging apparatus related to the present invention.
Figure 2B:
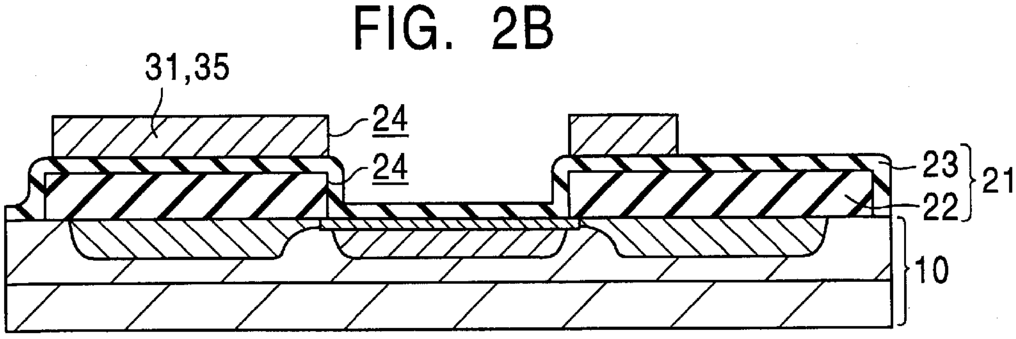

As shown in FIG. 2A, initially, a semiconductor substrate 10 made of a $P^+$-type silicon substrate 11 deposited with a p-type epitaxial layer 12 is prepared. Next, a $P^+$ area 13 and an $n^+$ area 16 that should be linked with a pn-junction 15 comprising an $n^{++}$ area 14 and an extraction electrode (not shown) are respectively formed by means of diffused layers in order that a proper density condition and a proper junction depth for generating discharge of electrons by the avalanche effect can be secured. The $p^+$ area 13, $n^{++}$ area 14, and the $n^+$ area 16, are respectively formed by forming a conventional resist mask and conducting an ion implantation on the formed mask.ion implantation Next, as shown in FIG. 2B, the first insulating film 22 is formed on the semiconductor substrate 10 deposited with a p-type epitaxial layer 12. Next, by utilizing a conventional lithographic technique (comprising a variety of techniques for forming resist mask via resist-coating, exposure, and developing processes for example), resist mask (not shown) is formed in order to form a first aperture 24 for constituting an electron discharging portion. Next, the first insulating film 22 is subject to a patterning process via an etching means using the prepared resist mask before eventually forming the first aperture portion 24 for constituting an electron discharging portion.

Next, the second insulating film 23 having an etching-stopper function is formed with a silicon nitride film for example. After completing the above-referred processes, the insulating film 21 is formed. Further, the electrode film 35 made from polycrystalline silicon for example is formed on the second insulating film 23.

Next, using a lithographic technique, resist mask (not shown) is formed in order to treat the electrode film 35 with a patterning process. After executing the patterning process against the electrode film 35 via an etching process utilizing resist mask, the first aperture 24 used for forming the electron discharging portion is also formed on the electrode film 35. At the same time, the accelerating electrode 31 is also formed.

Figure 2C:
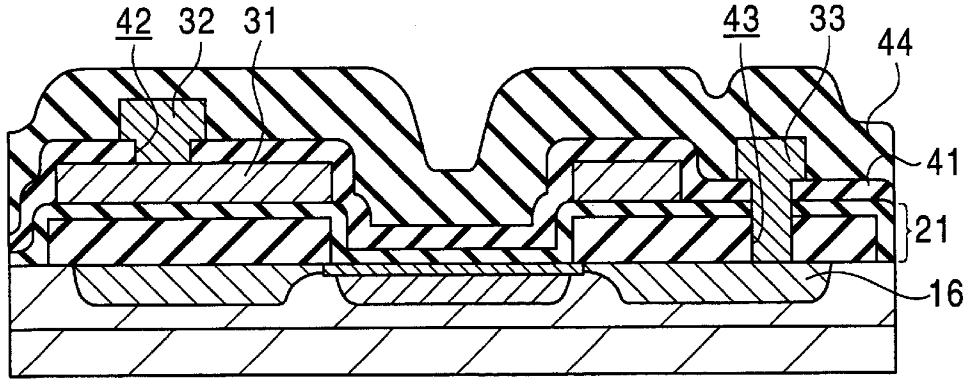

Further, as shown in FIG. 2C, the third insulating film 41 for covering the accelerating electrode 31 is formed on the insulating film 21 with silicon oxide for example. Next, by applying a lithographic technique, resist mask necessary for forming desired connecting holes is formed. Next, a connecting hole 42 connecting to the accelerating electrode 31 is formed on the third insulating film 41 via an etching process by utilizing the prepared resist mask. Next, a connecting hole 43 connecting to the $n^+$ area 16 is formed through the first insulating film 21 and the third insulating film 41.

Further, availing of a conventional technique for forming an aluminum electrode, an extraction electrode 32 connecting to the accelerating electrode 31 via the connecting hole 42 is formed. Further, another extraction electrode 33 connecting to the $n^+$ area 16 via the connecting hole 43 is formed. The patterning process used for forming the extraction electrodes 32 and 33 is executed by effecting a dry-etching by applying resist mask which is previously formed via a lithographic technique. Next, a protecting film 44 composed of a silicon nitride film for example is formed on the third insulating film 41 by way of superficially covering the extraction electrodes 32 and 33.

Figure 2D:
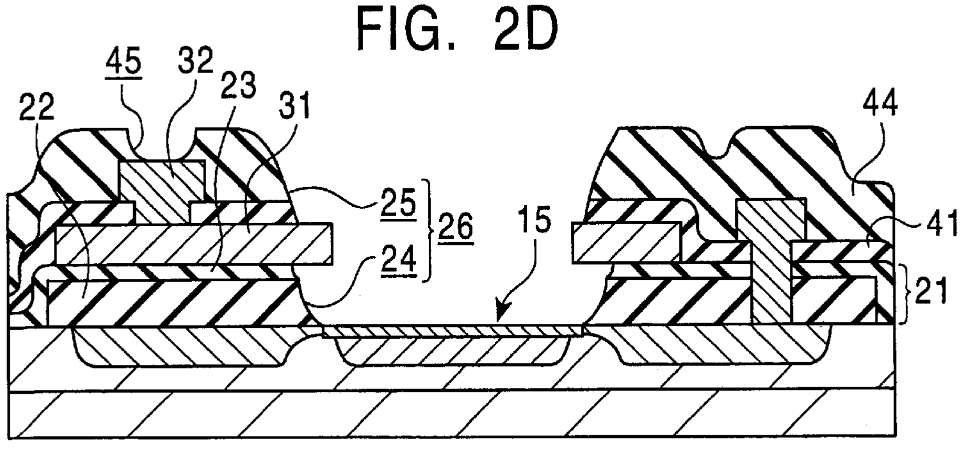

Next, as shown in FIG. 2D, using the lithographic and etching techniques, the protecting film 33, the second insulating film 23, and the third insulating film 41, are respectively etched whereby forming the second aperture 25. Next, the protecting film 44, the second insulating film 23, and the third insulating film 41 buried in the above-referred first aperture portion 24 are respectively removed before opening the first aperture portion 24 over again. Next, an aperture portion 26 is formed on the pn-junction 15 for constituting an electron discharging portion from the first aperture portion 24 and the second aperture portion 25.

Further, availing of the lithographic and etching techniques, another aperture portion 45 used for wire-bonding and connecting to the extraction electrode 32 is formed through the protecting film 44. Next, the first insulating film 21 below the accelerating electrode 31 on the part of the first aperture portion 24 is removed via an etching process, whereby forming the overhanging accelerating electrode 31 in the first aperture portion 24.

The applicable requirements for executing the above etching process comprise 13.56 MHz of frequency applying to an anode couple; tetrafluoromethane ($CF_4$) used for etching gas and delivered at a flow rate of 100 $cm^3$/min., whereas power density is set to be 0.03 $W/cm^2$ and pressure of etching gas is set to be 13 Pa. Alternatively, availing of remote-plasma control system, microwave-frequency is set to be 2.45 GHz, whereas nitrogen trifluoride, i.e., ($NF_3$) is used for etching gas which is to be supplied at a flow rate of 100 $cm^3$/min.; and pressure of etching gas is regulated to be 13 Pa. As a result, in the same way as was described above, the protecting film 45 and the second insulating film 23 are isotropically etched, whereby achieving such a shape exactly identical to that of the above embodiment.

By way of implementing the above-specified etching condition, inasmuch as the protecting film 45 composed of silicon nitride for example and the second insulating film 23 composed of silicon nitride for example are isotropically etched, as shown in FIG. 2D, such an accelerating electrode 31 disposed as of the state being overhung against the aperture 26 is formed.

When implementing the above-referred first manufacturing method, the resist mask formed via the above-referred lithographic technique is removed immediately after completing an ion implantation process or an etching process. Further, it is desired that barrier metal (not shown) be formed below the above-referred extraction electrodes 32 and 33.

The above-referred first manufacturing method comprises serial steps including a step of removing an insulating film 21 (consisting of a first insulating film 21 and a second insulating film 23) on the part of an aperture 26 (i.e., a first aperture 24) below an accelerating electrode 31 via an isotropical etching process and a step of forming the accelerating electrode 31 in the state projecting itself from the first aperture 24. As a result, the lateral and bottom surfaces of the accelerating electrode 31 on the part of the first aperture 24 are respectively formed by way of projecting themselves against the first aperture 24. This in turn provides the accelerating electrode 31 with a greater exposure area against the electron discharging portion consisting of a pn-junction 15 than that of such an accelerating electrode provided for any of conventional electron discharging apparatuses. Because of this, the accelerating electrode 31 enables electrons discharged from the pn-junction 15 to be accelerated to full extent.

Figure 3:
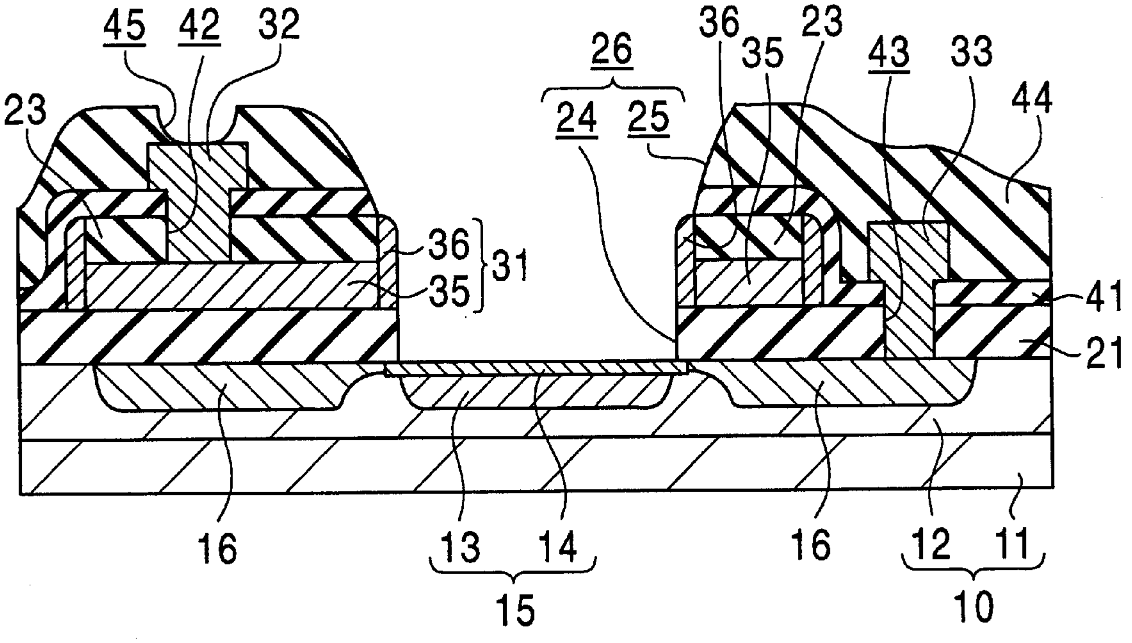
FIG. 3 is a simplified schematic cross-sectional view illustrating an embodiment for realizing the second electron discharging apparatus related to the present invention.

Next, referring to a simplified schematic cross-sectional view shown in FIG. 3, an embodiment for realizing the second electron discharging apparatus related to the present invention is described below. In FIG. 3, those components exactly identical to those shown in FIG. 1 are respectively designated by identical reference numerals.

As shown in FIG. 3, a semiconductor substrate 10 consists of a $p^+$ type silicon substrate 11 and a p-type epitaxial layer 12 formed thereon. A p-type area 13 is formed on the p-type epitaxial layer 12 in order that a proper density condition and a proper junction depth can be secured so as to generate discharge of electrons via avalanche effect. In addition, an $n^{++}$ area 14 is formed on the $p^+$ area 13, whereby forming a pn-junction 15. Further, an $n^+$ area 16 to be connected to the $n^{++}$ area 14 is formed on the p-type epitaxial layer 12.

A first insulating film 21 composed of a silicon oxide film for example is formed on the semiconductor substrate 10 by way of superficially covering the $n^+$ area 16. A first aperture 24 is formed through the insulating film 21 on the pn-junction 15. An accelerating electrode 31 composed of polycrystalline silicon for example is formed with a substantially L-shaped configuration at its cross-section on the insulating film 21 by way of surrounding the first aperture 24.

The accelerating electrode 31 consists of an electrode film 35 formed at a predetermined position on the insulating film 21 and a side-wall electrode 36 which is formed on the insulating film 21 and along the periphery of the first aperture 24 as of the substantially L-shape configuration at the cross-section. Further, a second insulating film 23 is formed on the electrode film 35.

Further, a third insulating film 41 is formed on the semiconductor substrate 10 by way of superficially covering the accelerating electrode 31, the second insulating film 23, and the first insulating film 21.

A connecting hole 42 connecting to the above-referred accelerating electrode 31 is formed through the second insulating film 23 and the third insulating film 41. The connecting hole 42 accommodates an extraction electrode 32 which is made from aluminum for example and connected to the accelerating electrode 31. Another connecting hole 43 connecting to the $n^+$ area 16 is formed through the first insulating film 21 and the third insulating film 41. Further, another extraction electrode 33 which is made from aluminum for example and connected to the $n^+$ area 16 is formed in the connecting hole 43.

Further, a protecting film 44 is formed on the third insulating film 41 by way of superficially covering the extraction electrodes 32 and 33. A second aperture 25 connecting to the first aperture 24 is formed through the third insulating film 41 and the protecting film 44, whereby forming an aperture 26. An aperture 45 connecting to the extraction electrode 32 is formed through the protecting film 44.

The accelerating electrode 31 may also be formed by way of projecting itself from the aperture 26. More particularly, the aperture 24 is formed by over etching to the bottom side of the accelerating electrode 31, whereby the accelerating electrode 31 may be formed by way of being overhung against the first aperture 24.

In the second electron discharging apparatus according to the first embodiment for implementing the present invention, the accelerating apparatus 31 is formed into a substantially L-shaped configuration at its cross-section, comprising the electrode film 35 and the side-wall electrode 36. Accordingly, the vertical-wall portion of the substantially L-shaped accelerating electrode 31, in other words, the side-wall electrode 36 is formed on the side of the aperture 26 (i.e., the first aperture 24). As a result, the accelerating electrode 31 is provided with a greater exposure area against the electron discharging portion consisting of a pn-junction than that of such an accelerating electrode provided for any of conventional electron discharging apparatuses. Because of this, electrons emitted from the electron discharging portion consisting of a pn-junction can be accelerated to full extent by the accelerating electrode 31 related to the present invention.

Next, referring to the cross-sectional views explanatory of manufacturing processes shown in FIG. 4, the first embodiment for implementing the second method for manufacturing the inventive electron discharging apparatus is described below. In FIG. 4, those components exactly identical to those shown in FIG. 3 are designated by identical reference numerals.

Figure 4A:
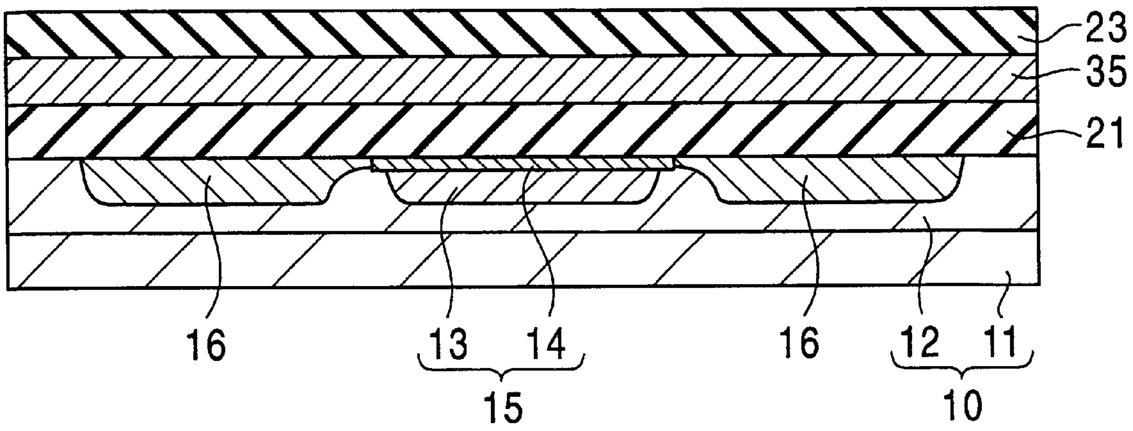
FIGS. 4A–4E are a simplified schematic cross-sectional view illustrating an embodiment for implementing the second method for manufacturing the electron discharge apparatus related to the present invention.

As shown in FIG. 4A, initially, a semiconductor substrate 10 consisting of a $p^+$ type silicon substrate 11 deposited with a p-type epitaxial layer 12 is prepared. Next, in order that a proper density condition and a proper junction depth to ensure generation of the discharge of electrons via avalanche effect can be secured, a $p^+$ area 13, a pn junction 15 by means of an $n^{++}$ area 14, and an $n^+$ area to be connected to an extraction electrode (not shown), are respectively formed on the semiconductor substrate 10 by means of diffused layers. After forming such a conventional resist mask, the $P^+$ area 13, $n^{++}$ area 14, and the $n^+$ area 16, are respectively formed by applying an ion implantationimplantation method using the prepared mask. These processes described above are identical to the preceding steps shown in FIG. 2A.

Next, a first insulating film 21 made from a silicon oxide film for example is formed on the semiconductor substrate 10 bearing the above-referred diffused layers. Next, an electrode film 35 composed of polycrystalline silicon for example is formed on the first insulating film 21. Further, a second insulating film 23 is formed with a silicon oxide film for example.

Figure 4B:
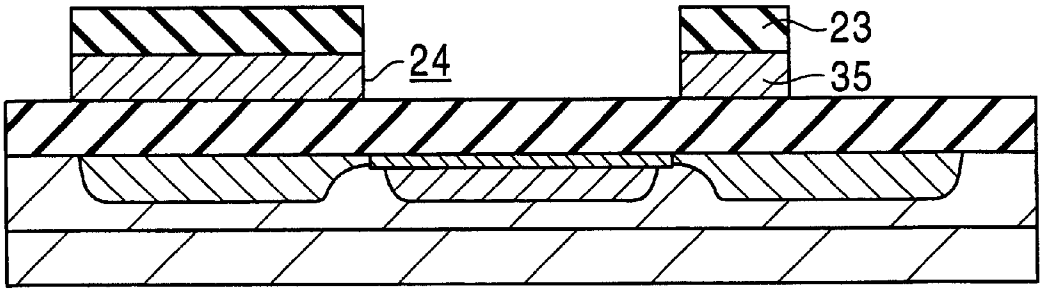

Next, as shown in FIG. 4B, using a lithographic technique, a first aperture 24 for constituting an electron discharging portion is formed. Next, resist mask (not shown) necessary for forming an accelerating electrode is formed. Then, the second insulating film 23 and the electrode film 35 are respectively subject to a patterning process using etching with mask made from said resist mask, and then, a first aperture 24 for forming the electron discharging portion is formed.

Figure 4C:
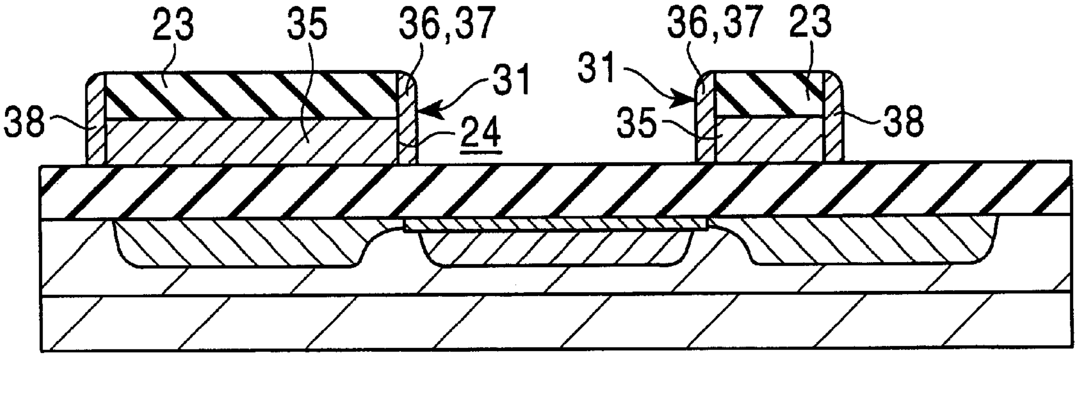

Next, as shown in FIG. 4C, including the inner surface of the first aperture 24, a side-wall electrode forming film 37 is formed on the second insulating film 23. Next, by way of etching back the whole surface of the side-wall electrode forming film 37, a side-wall electrode 36 is formed on the lateral wall of the first aperture 24. By implementing these processes, such an accelerating electrode 31 having a substantially L-shaped configuration at a cross-sectional plane is formed by means of the electrode film 35 and the side-wall electrode 36.

Such a side wall 38 identical to that of the sidewall electrode 36 is also formed for a lateral wall outside of such a pattern composed of the accelerating electrode 31 and the second insulating film 23 formed thereon by implementing the above-referred etch-back process.

Figure 4D:
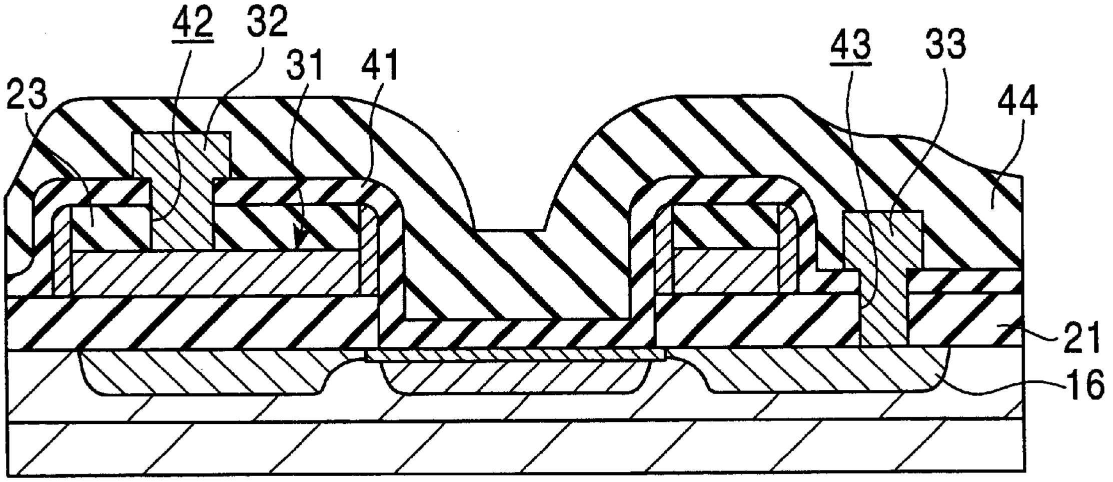

Further, as shown in FIG. 4D, a third insulating film 41 composed of silicon oxide for example is formed on the first insulating film 21 in order to superficially cover the accelerating electrode 31 and the second insulating film 23. Next, resist mask necessary for forming a desired connecting hole is formed by applying a lithographic technique. Next, a connecting hole 42 connecting to the accelerating electrode 31 is formed on the third insulating film 41 via an etching process using said resist mask. At the same time, another connecting hole 43 connecting to the $n^+$ area 16 is formed through the first insulating film 21 and the third insulating film 41.

Further, by applying a conventional technique for forming an aluminum electrode, an extraction electrode 32 connecting to the accelerating electrode 31 is formed via the connecting hole 42, and, another extraction electrode 33 connecting to the n+ area 16 is formed via the connecting hole 43. After forming resist mask via a lithographic technique, patterning is executed to form the extraction electrodes 32 and 33 using a dry etching process with the resist mask. Next, a protecting film 44 composed of a silicon nitride film for example is formed on the third insulating film 41 in order to superficially cover the extraction electrodes 32 and 33.

Figure 4E:
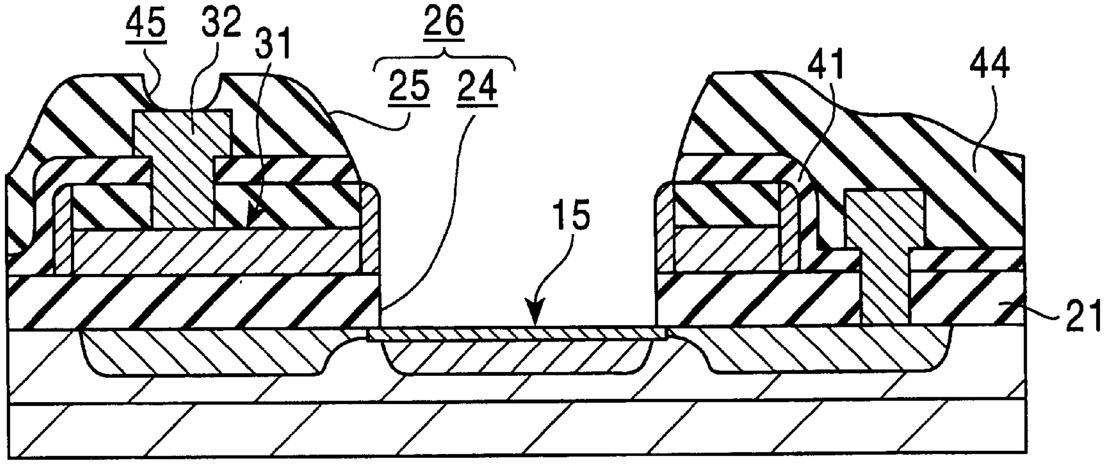

Next, as shown in FIG. 4E, the protecting film 44 and the third insulating film 41 are respectively etched by applying lithographic and etching techniques whereby forming a second aperture 25. Next, the protecting film 44 and the third insulating film 41 buried in the first aperture 24 are respectively removed before opening the first aperture 24 over again.

Further, another aperture 45 for wire-bonding and connecting to the above-referred extraction electrode 32 is formed through the protecting film 44 by applying lithographic and etching techniques. Further, the first aperture 24 is formed by way of extending itself up to the first insulating film 21 so that the pn-junction 15 is exposed. In consequence, an aperture 26 is formed with the first aperture 24 and the second aperture 25 on the pn-junction 15 which constitutes an electron discharging portion. Further, when executing the etching process, it is also possible to execute a side-etching process against the first insulating film 21 from the side of the first aperture 24 to form the accelerating electrode 31 in the state being overhung against the first aperture 24.

In the above-referred second manufacturing method related to the present invention, immediately after completing an ion implantation process or an etching process, resist mask (not shown) formed via the above-referred lithographic technique is removed. Further, it is desired that barrier metal (not shown) be formed below the above-referred extraction electrodes 32 and 33.

In the second manufacturing method related to the present invention, initially, a side-wall electrode 36 connecting to an electrode film 35 is formed on the lateral surface of an aperture 26 (corresponding to a first aperture 24) whereby forming an accelerating electrode 31 with the electrode film 35 and the side-wall electrode 36. Accordingly, the accelerating electrode 31 is formed into a substantially L-shaped configuration at a cross-sectional surface. And yet, inasmuch as the side-wall electrode 36 for constituting a substantially L-shaped vertical wall portion is formed by way of facing the first aperture 24, the accelerating electrode 31 is provided with a greater exposure area with respect to the electron discharging portion consisting of the pn-junction 15 than that of such an accelerating electrode provided for any of conventional electron discharging apparatuses. Because of this, the accelerating electrode 31 may fully accelerates electrons discharged from the pn-junction 15.

Figure 5:
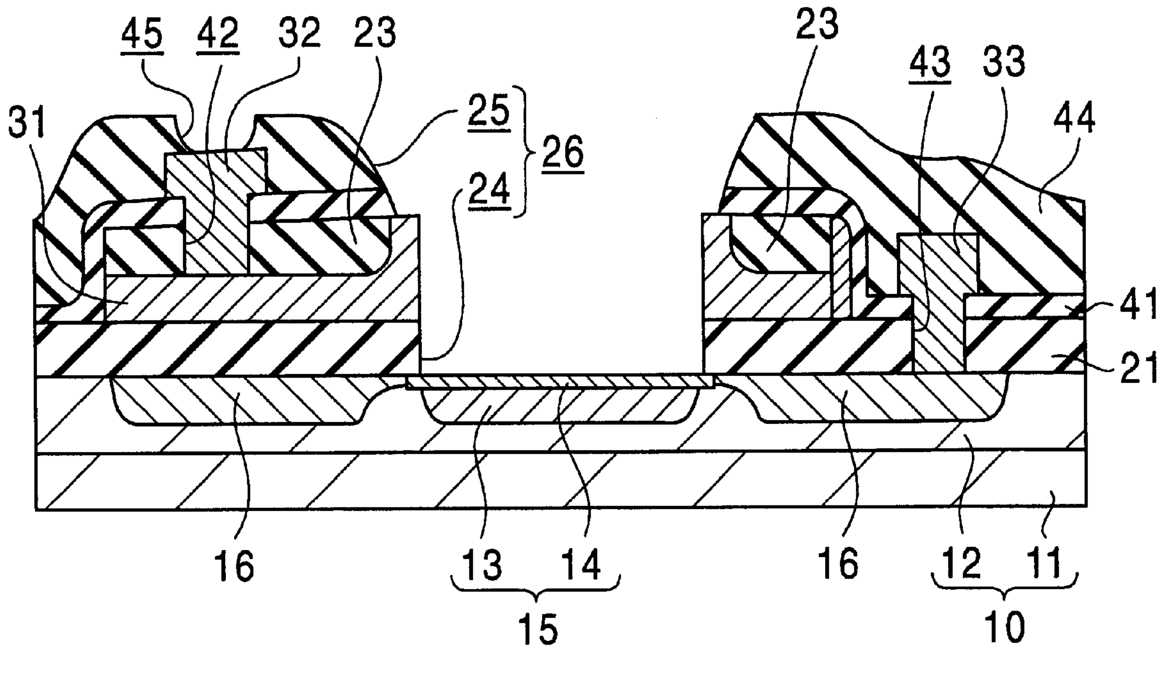
FIG. 5 is a simplified schematic cross-sectional view illustrating an embodiment for realizing the third electron discharging apparatus related to the present invention.

Next, referring to a simplified schematic cross-sectional view shown in FIG. 5, the second embodiment for realizing the second electron discharging apparatus related to the present invention is described below. In FIG. 5, those components identical to those which are shown in FIGS. 1 and 3 are respectively designated by identical reference numerals.

As shown in FIG. 5, a semiconductor substrate 10 consisting of a p+ type silicon substrate 11 and a p-type epitaxial layer 12 formed thereon is initially prepared. In order to secure a proper density condition and a proper junction depth for enabling discharge of electrons to take place via avalanche effect, a p+ area 13 is formed on the p-type epitaxial layer 12. In addition, an n++ area 14 is formed on the p+ area 13 whereby forming a pn junction 15. Further, an n+ area 16 connecting to the n++ area 14 is formed on the p-type epitaxial layer 12.

A first insulating film 21 composed of a silicon oxide film for example is formed on the semiconductor substrate 10 by way of superficially covering the n+ area 16. In addition, a first aperture 21 is formed through the first insulating film 21 on the pn-junction 15. Further, an accelerating electrode 31 composed of polycrystalline silicon for example is formed on the first insulating film 21 on the part of the first aperture 24 so as to surround the first aperture 24.

The accelerating electrode 31 is composed of an annular electrode film having a substantially L-shaped configuration, which is formed along the periphery of the first aperture 24 and at a predetermined position on the first insulating film 21. Further, a second insulating film 23 is formed on the accelerating electrode 31. Alternatively, the second insulating film 23 may be excluded.

Further, a third insulating film 41 is formed on the semiconductor substrate 10 by way of superficially covering the accelerating electrode 31, the first insulating film 21, and the second insulating film 23.

A connecting hole 42,connecting to the above-referred accelerating electrode 31 is formed through the second insulating film 23 and the third insulating film 41. An extraction electrode 32 made from aluminum for example and connecting to the accelerating electrode 31 is formed in the connecting hole 42. Further, another connecting hole 43 connecting to the n+ area 16 is formed through the first insulating film 21 and the third insulating film 41. Another extraction electrode 33 made from aluminum for example connecting to the n+ area 16 is formed in the connecting hole 43.

A protecting film 44 is formed on the third insulating film 41 by way of superficially covering the extraction electrodes 32 and 33. A second aperture 25 connecting to the first aperture 24 is formed through the protecting film 44 and the[]third insulating film 41, whereby forming an aperture 26. Another aperture 45 connecting to the extraction electrode 32 is formed through the protecting film 44.

The accelerating electrode 31 may be formed by way of projecting itself into the aperture 26. More particularly, inasmuch as the first aperture 24 is formed by over etching to the bottom side of the accelerating electrode 31, the accelerating electrode 31 may be formed by way of being overhung against the first aperture 24.

In the above-described second electron discharging apparatus according to the second embodiment of the present invention, the accelerating electrode 31 is formed into a substantially L-shaped configuration at a cross-sectional plane, and, the vertical portion of the substantially L-shaped accelerating electrode 31 is disposed so as to form surrounding wall of the aperture 26 which corresponding to the first aperture 24. Accordingly, the accelerating electrode 31 is provided with a greater exposure area with respect to the electron discharging portion consisting of the pn-junction 15 than that of such an accelerating electrode provided for any of conventional electron discharging apparatuses. Because of this, electrons emitted from the electron discharging portion may be fully accelerated by the accelerating electrode 31 related to the present invention.

Next, referring to cross-sectional views shown in FIG. 6, an embodiment for implementing the third method for manufacturing the electron discharging apparatus related to the present invention is described below. In FIG. 6, those components exactly identical to those shown in FIG. 3 are designated by identical reference numerals.

Figure 6A:
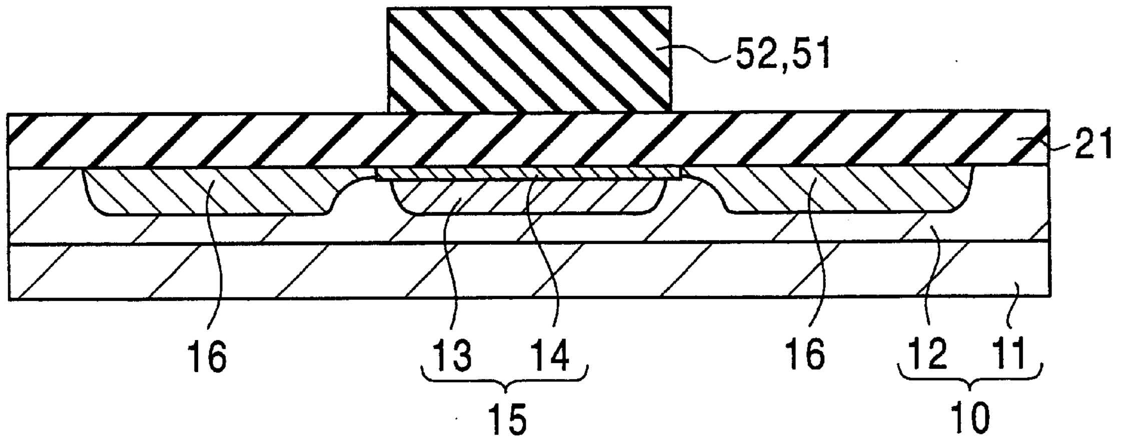
FIGS. 6A–6E are a simplified schematic cross-sectional view illustrating an embodiment for implementing the third method for manufacturing the electron discharging apparatus related to the present invention.

As shown in FIG. 6A, initially, a semiconductor substrate 10 is prepared by depositing a p-type epitaxial layer 12 on a P+ type silicon substrate 11. Next, in order to secure a proper density condition and a proper junction depth for enabling discharge of electrons to take place via avalanche effect, a P+ area 13, a pn-junction 15 composed of an n++ area 14, and an N+ area 16 for connection to an extraction electrode (not shown), are respectively formed on the semiconductor substrate 10 with diffused layers. After forming conventional resist mask, the P+ area 13, n++ area 14, and the n+ area 16, are respectively formed by applying an ion implantation method using the resist mask. These serial processes are identical to those which are shown in FIG. 2A.

Next, a first insulating film 21 composed of a silicon oxide film for example is formed on the semiconductor substrate 10 provided with the above-referred diffused layers. Next, a dummy film 51 composed of silicon oxide for example is formed on the first insulating film 21. Next, by applying a lithographic technique, resist mask (not shown) necessary for forming a dummy pattern is formed at such a position designated for constituting the electron discharging portion, and then, patterning is executed against the dummy pattern 51 with an etching process using the prepared resist mask before forming a new dummy pattern 52 on the electron discharging portion.

Figure 6B:
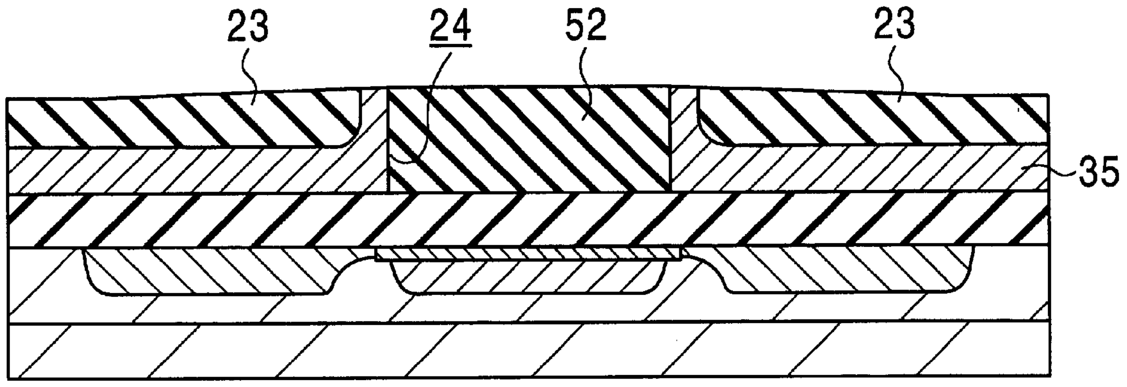

Next, as shown in FIG. 6B, an electrode film 35 is formed by way of fully covering the dummy pattern 52, and then, a second insulating film 23 being a leveled insulating film is formed on the electrode film 35. Next, the second insulating film 23 and the electrode film 35 formed on the dummy pattern 52 are respectively etched back to cause the upper surface of the dummy pattern 52 to be exposed. Alternatively, in place of the etch-back process, a chemical mechanical polishing (CMP) process may also be executed to expose the upper surface of the dummy pattern 52.

Next, a first aperture 24 is formed by selectively removing the dummy pattern 52. At the same time, the second insulating film 23 may also be removed.

Figure 6C:
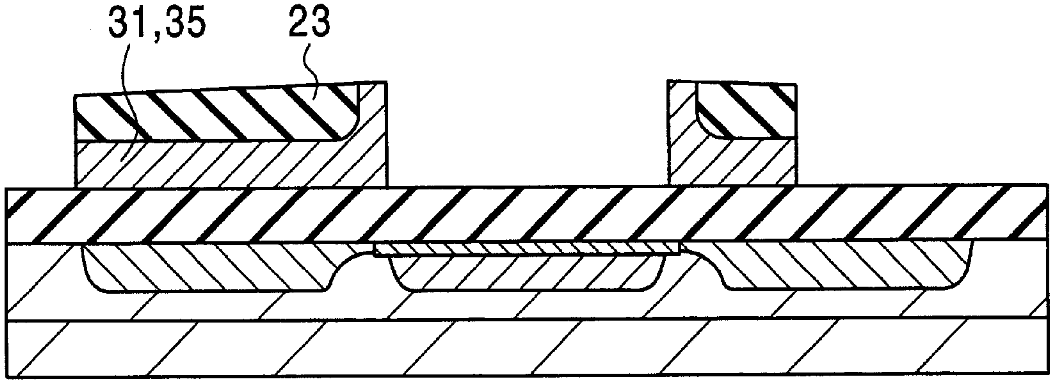

Next, as shown in FIG. 6C, using a lithographic technique, resist mask (not shown) is formed for patterning the electrode film 35 and the second insulating film 23. Then, a process for patterning the second insulating film 23 and the electrode film 35 is executed by applying an etching process using the prepared resist mask, and finally, an accelerating electrode 31 is formed by means of the electrode film 35.

Figure 6D:
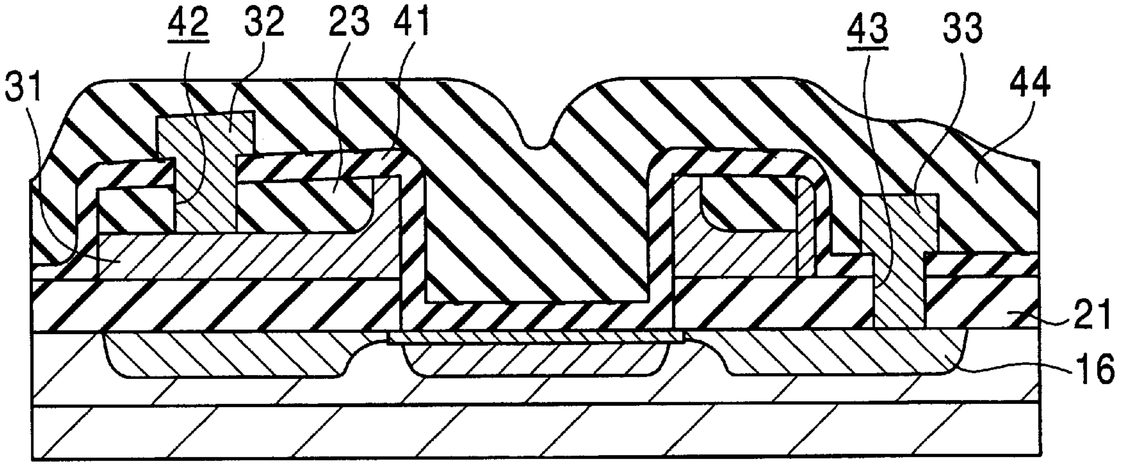

Next, as shown in FIG. 6D, a third insulating film 41 composed of silicon oxide for example is formed on the first insulating film 21 in order to fully cover the accelerating electrode 31 and the second insulating film 23. Next, by applying a lithographic technique, resist mask necessary for forming desired connecting holes is formed. Next, a connecting hole 42 connecting to the accelerating electrode 31 is formed through the third insulating film 41 with an etching process using the prepared resist mask. Next, another connecting hole 43 connecting to the n+ area 16 is formed through the first insulating film 21 and the third insulating film 41.

Next, using a conventional technique for forming an aluminum electrode, an extraction electrode 32 connecting to the accelerating electrode 31 via the connecting hole 42 is formed. Next, another extraction electrode 33 connecting to the n++ area 16 via the connecting hole 43 is formed. In order to form the extraction electrodes 32 and 33, a patterning process is executed by initially forming resist mask via a lithographic technique followed by a dry etching process using the prepared resist mask. Next, a protecting film 44 made from silicon nitride for example is formed on the third insulating film 41 by way of fully covering the extraction electrodes 32 and 33.

Figure 6E:
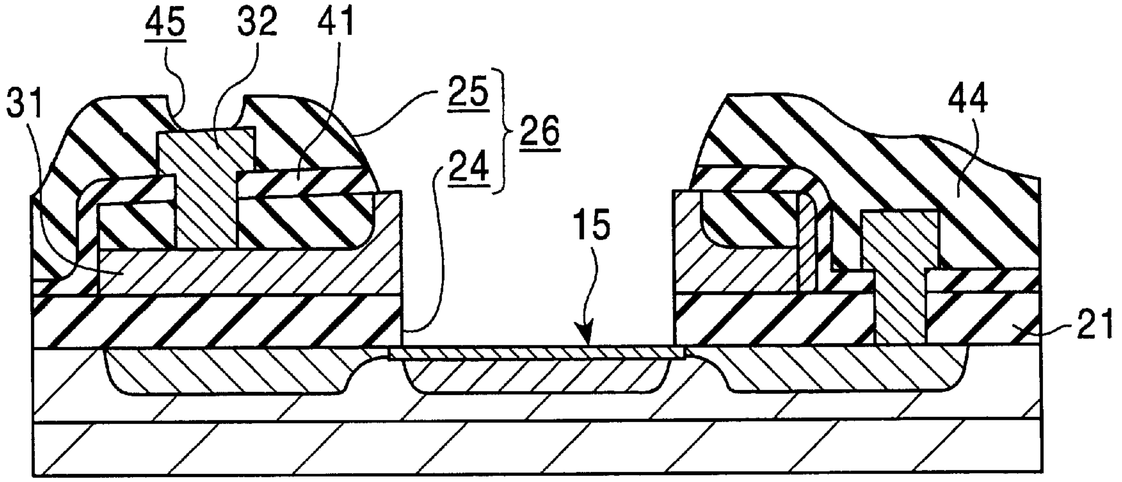

Next, as shown in FIG. 6E, by applying the lithographic and etching techniques, a second aperture 25 is formed by etching the protecting film 44 and the third insulating film 41. Next, the protecting film 44 and the third insulating film 41 buried in the first aperture 24 are respectively removed and then the first aperture 24 is again opened.

Further, by applying the lithographic and etching techniques, an aperture 45 used for wire-bonding and connecting to the extraction electrode 32 is formed through the protecting film 44, and then, the first aperture 24 is extended to the first insulating film 21 in order that the pn-junction 15 can be exposed. As a result, an aperture 26 comprising the first aperture 24 and the second aperture 25 is formed on the pn-junction 15 which constitutes the electron discharging portion When executing the etching process, by way of side-etching the first insulating film 21 from the side of the first aperture 24, the accelerating electrode 31 may be formed by way of being overhung against the first aperture 24.

When executing the third manufacturing method described above, resist mask (not shown) formed via the lithographic technique is removed immediately after completing an ion implantation process or an etching process. Further, it is desired that barrier metal (not shown) be disposed below the extraction electrodes 32 and 33.

The above described third manufacturing method comprises those steps including: a step of forming an electrode film 35 used for forming an accelerating electrode 31 by way of covering a dummy pattern 52; a step of forming a second insulating film 23 being a leveled insulating film on the electrode film 35; and a step of etching back the second insulating film 23 in order to selectively remove the electrode film 35 on the dummy pattern 52. As a result, the electrode film 35 is formed into a substantially L-shaped configuration at a cross-sectional plane along the lateral surface of the dummy pattern 52. Inasmuch as the third method further includes a step of removing the dummy pattern 52 before forming an aperture 26 corresponding to the first aperture 24, the substantially L-shaped vertical wall portion of the accelerating electrode 31 is formed by way of facing the first aperture 24. Accordingly, the accelerating electrode 31 is provided with a greater exposure with respect to the electron discharging portion consisting of a pn-junction 15 than that of such an accelerating electrode provided for any of conventional electron discharging apparatuses, whereby enabling the accelerating electrode 31 to fully accelerate electrons emitted from the pn-junction 15.

Figure 7:
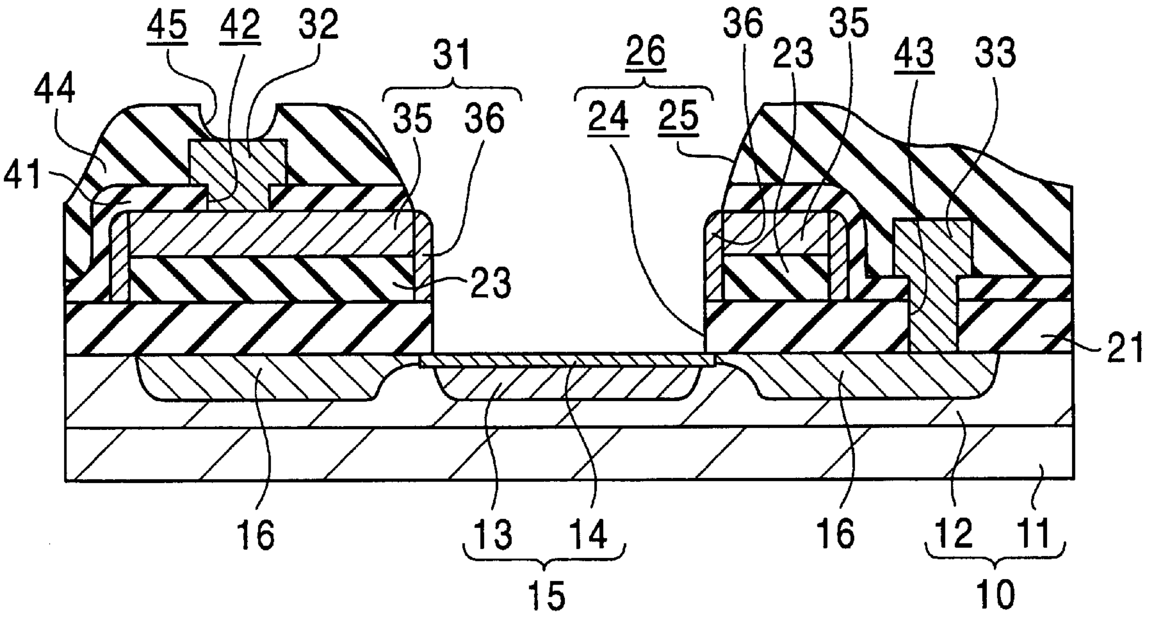
FIG. 7 is a simplified schematic cross-sectional view illustrating an embodiment for realizing the fourth electron discharging apparatus related to the present invention.

Referring now to a schematic cross-sectional view shown in FIG. 7, an embodiment for realizing the third electron discharging apparatus related to the present invention is described below. In FIG. 7, those components identical to those shown in FIG. 1 are respectively designated by identical reference numerals.

As shown in FIG. 7, a semiconductor substrate 10 is provided, which consists of a p+ silicon substrate 11 and a p-type epitaxial layer 12 formed thereon. In order to secure a proper density condition and a proper junction depth to enable discharge of electrons to take place via avalanche effect, a p+ area 13 is formed on the p-type epitaxial layer 12, and, an n++ area 14 is formed on the p+ area 13, whereby forming a pn-junction 15. Further, an n+ area 16 connecting to the n++ area 14 is formed on the p-type epitaxial layer 12.

A first insulating film 21 composed of a silicon oxide film for example is formed on the semiconductor substrate 10 by way of fully, covering the n+ area 16. Further, a first aperture 24 is formed through the first insulating film 21 on the first aperture 24. Further, an accelerating electrode 31 which is composed of polycrystalline silicon for example and having a substantially inverse L-shaped configuration at a cross-sectional plane is formed on the first insulating film 21 on the part of the first aperture 24 by way of surrounding the first aperture 24.

The accelerating electrode 31 is formed into a substantially inverse L-shaped configuration by means of an electrode film 35 formed at a specific position on the first insulating film 21 and a side-wall electrode 36 which is formed on the first insulating film 21 and circumferentially surrounding the first aperture 24.

Further, a third insulating film 41 is formed on the semiconductor substrate 10 by way of fully covering a second insulating film 23, the accelerating electrode 31, and the first insulating film 21.

A connecting hole 42 connecting to the accelerating electrode 31 is formed through the third insulating film 41. An extraction electrode 32 made from aluminum for example connecting to the accelerating electrode 31 is formed inside of the connecting hole 42. Another connecting hole 43 connecting to the n+ area 16 is formed through the first insulating film 21 and the third insulating film 41. Further, another extraction electrode 33 connecting to the n+ area 16 via the connecting hole 43 is also formed.

Further, a protecting film 44 is formed on the third insulating film 41 by way of fully covering the extraction electrodes 32 and 33. A second aperture 25 connecting to the first aperture 24 is formed through the protecting film 44 and the third insulating film 41. An aperture 26 is formed by means of the first aperture 24 and the second aperture 25. Further, another aperture 45 connecting to the extraction electrode 32 is formed through the protecting film 44.

The accelerating electrode 31 may be formed by way of projecting itself into the aperture 26. More particularly, the first aperture 24 may be formed by over etching the bottom side of the accelerating electrode 31 so that the accelerating electrode 31 may be formed by way of being overhung against the first aperture 24.

In the third electron discharging apparatus, inasmuch as the accelerating electrode 31 is formed into a substantially inverse L-shaped configuration at a cross-sectional plane by means of the electrode film 35 and a side-wall electrode 36, the substantially inverse L-shaped vertical-wall portion of the accelerating electrode 31, in other words, the side-wall electrode 36 is disposed so as to form side wall portion surrounding the aperture 26 which corresponding to the first aperture 24. Because of this arrangement, the accelerating electrode 31 is provided with a greater exposure area with respect to the electron discharging portion consisting of a pn-junction 15 than that of such an accelerating electrode provided for any of conventional electron discharging apparatuses, whereby enabling the accelerating electrode 31 to fully accelerate electrons emitted from the pn-junction 15.

Referring now to schematic cross-sectional views shown in FIG. 8, an embodiment for implementing the fourth method for manufacturing the electron discharging apparatus related to the present invention is described below. In FIG. 8, those components identical to those shown in FIG. 3 are respectively designated by identical reference numerals.

Figure 8A:
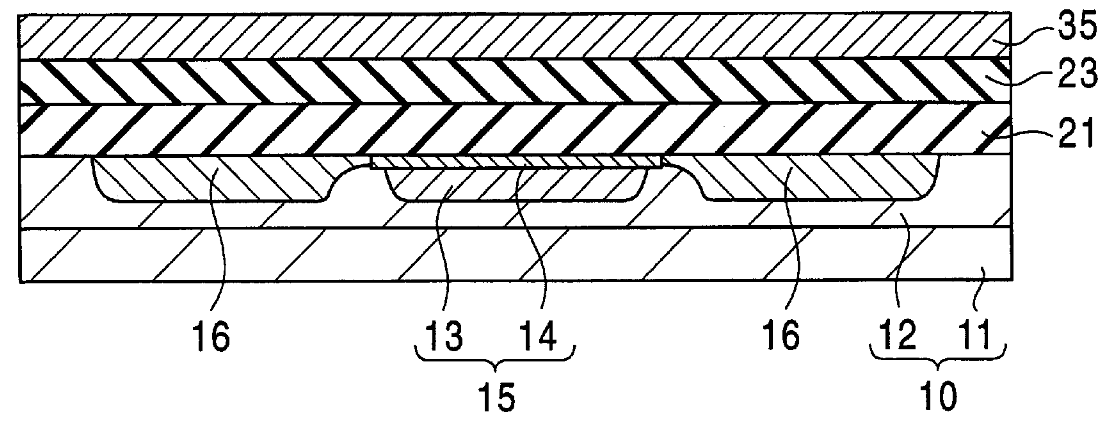
FIGS. 8A–8E are a simplified schematic cross-sectional view illustrating an embodiment for implementing the fourth method for manufacturing the electron discharging apparatus related to the present invention.

As shown in FIG. 8A, a semiconductor substrate 10 is provided, which consists of a p+ type silicon substrate 11 and a p-type epitaxial layer 12 deposited thereon. In order to secure a proper density condition and a proper junction depth to enable discharge of electrons to take place via avalanche effect, a p+ area 13, a pn-junction 15 consisting of an n++ area 14, and an n+ area 16 used for connection to an extraction electrode (not shown), are respectively formed on the semiconductor substrate 10 by means of diffused layers. After forming such a conventional resist mask, the p+ area 13, n++ area 14, and the n+ area 16, are respectively formed via an ion implantation method using the formed resist mask. These processes are identical to those which are described by way of referring to FIG. 2A.

Next, a first insulating film 21 composed of a silicon oxide film for example is formed on the above-referred semiconductor substrate 10 provided with the diffused layers. Next, a second insulating film 23 composed of a silicon nitride film for example is formed on the first insulating film 21. Further, an electrode film 35 composed of polycrystalline silicon for example is formed thereon.

Figure 8B:
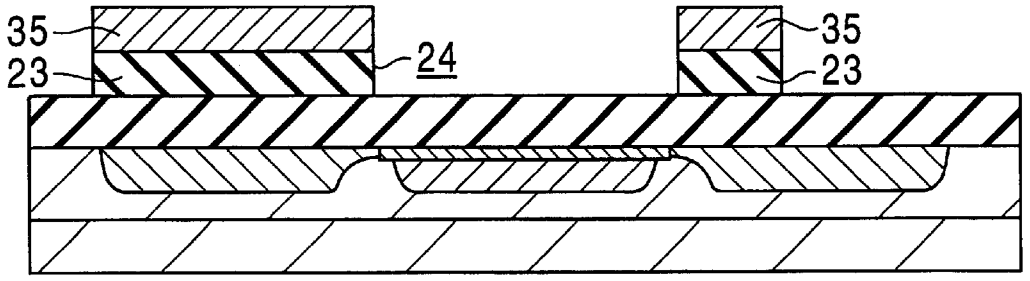

Next, as shown in FIG. 8B, using a lithographic technique, resist mask (not shown) necessary for forming an accelerating electrode in conjunction with a first aperture for constituting an electron discharging portion is formed. Next, the electrode film 35 and the second insulating film 23 are respectively patterned via an etching process using the formed resist mask. Next, a first aperture 24 necessary; for forming the electron discharging portion is formed.

Figure 8C:
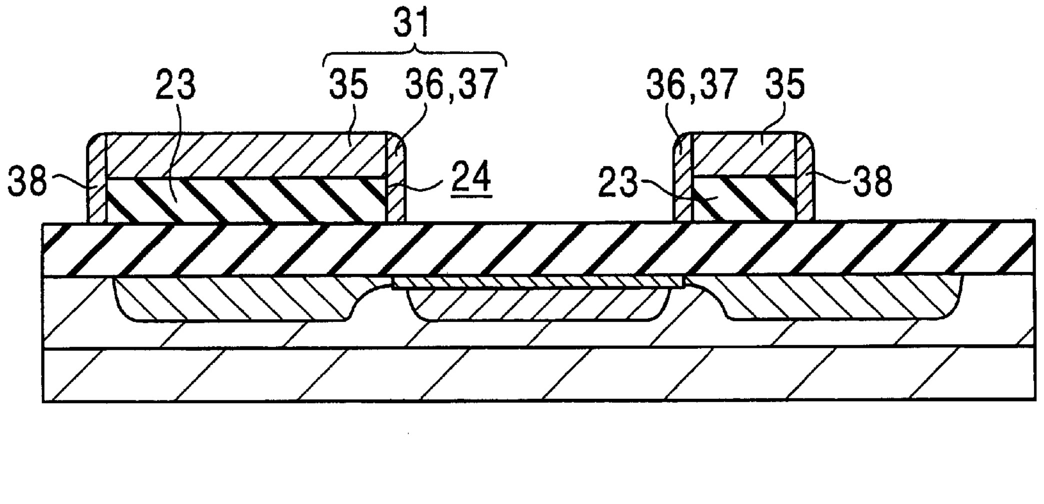

Next, as shown in FIG. 8C, including the inner surface of the first aperture 24, a side-wall electrode forming film 37 is formed on the electrode film 35. Next, whole surface of the side-wall electrode forming film 37 is etched back, whereby forming a side-wall electrode 36 on the lateral wall of the; first aperture 24. In this way, such a substantially inverse L-shaped accelerating electrode 31 via a cross-sectional view is formed by means of the electrode film 35 and the side-wall electrode 36.

Alternatively, an insulating film serving as an etching stopper may be formed on the electrode film 35 immediately after formation of the electrode film 35. By way of forming this insulating film, it is possible to prevent the electrode film 35 from excessively being etched during the etch-back process.

As a result of the above-referred etch-back process, another side wall 38 similar to the side-wall electrode 36 is also formed on the lateral wall outside of such a pattern consisting of the accelerating electrode 31 and the second insulating film 23 formed on the accelerating electrode 31.

Figure 8D:
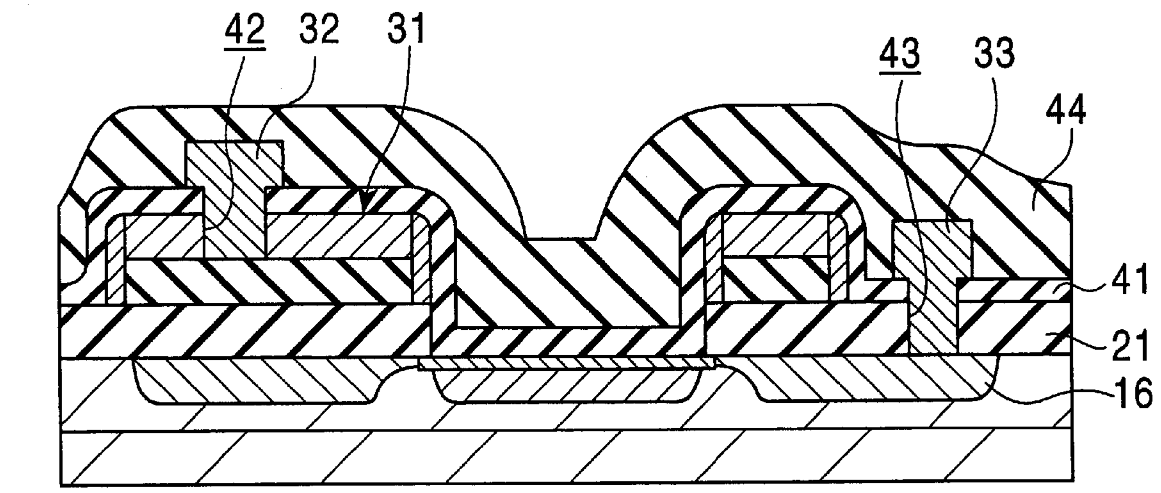

Further, as shown in FIG. 8D, a third insulating film 41 composed of silicon oxide for example for superficially covering the accelerating electrode 31 and the second insulating film 23 is formed on the first insulating film 21. Next, using a lithographic technique, resist mask necessary for forming desired connecting holes is formed. Next, a connecting hole 42 connecting to the accelerating electrode 31 is formed through the third insulating film 41 via an etching process using the formed resist mask. Next, another connecting hole 43 connecting to the n+ area 16 is formed through the first insulating film 21 and the third insulating film 41.

Further, using a conventional technique for forming an aluminum electrode, an extraction electrode 32 connecting to the accelerating electrode 31 via the connecting hole 42 is formed. Next, another extraction electrode 33 connecting to the n+ area 16 via the connecting hole 43 is formed. The patterning process for forming the extraction electrodes 32 and 33 are executed via a dry-etching process using resist mask previously formed by applying a lithographic technique. Next, a protecting film 44 composed of a silicon nitride film for example is formed on the third insulating film 41 by way of superficially covering the extraction electrodes 32 and 33.

Figure 8E:
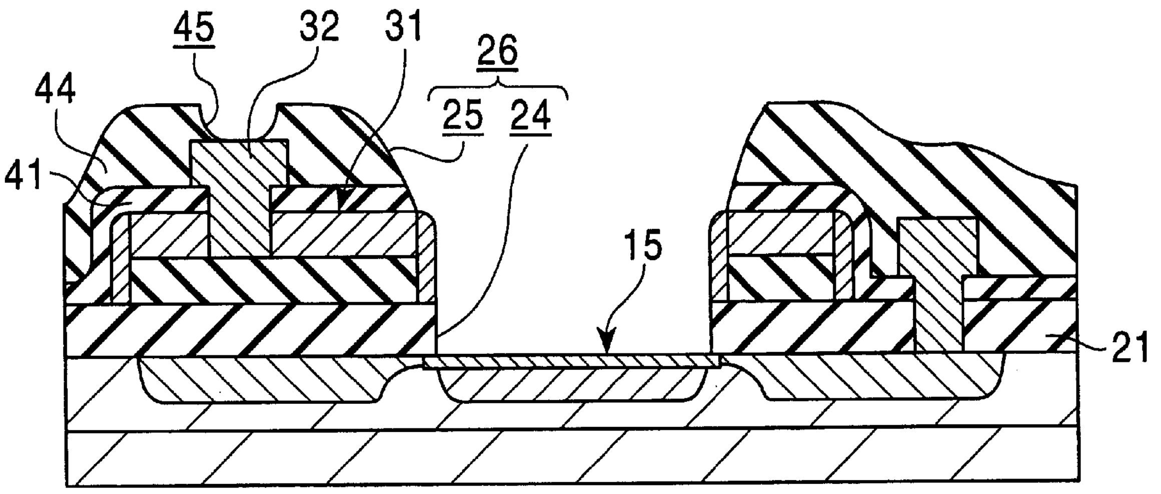
Figure 9:
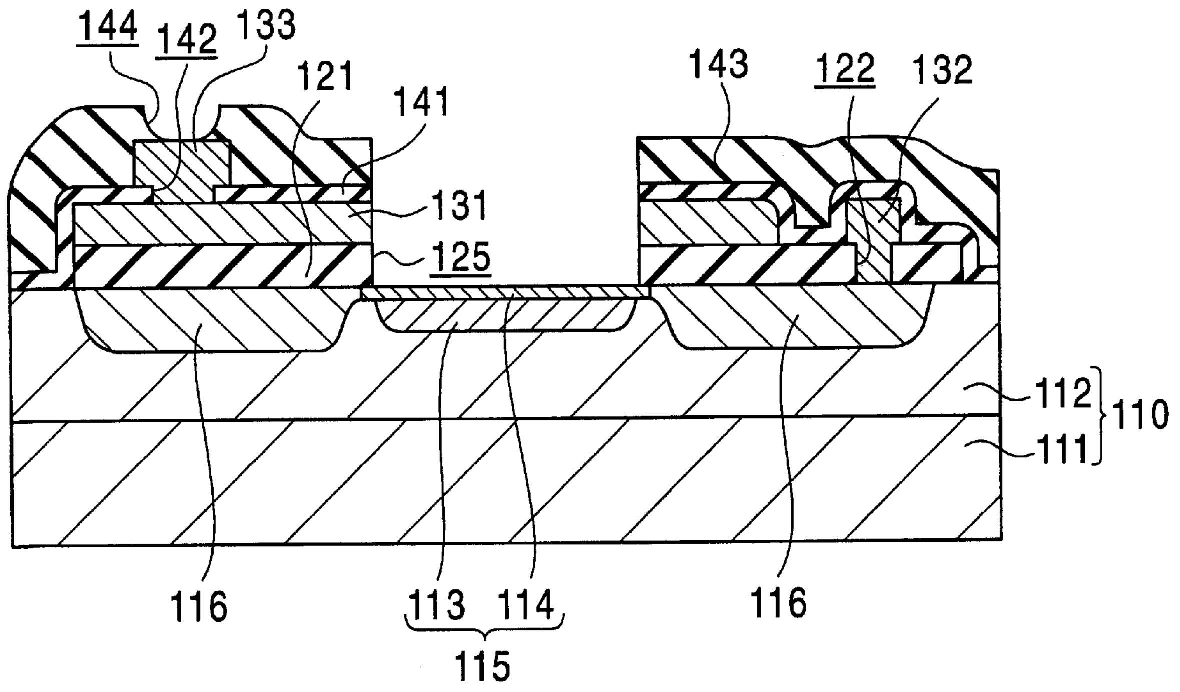
FIG. 9 is a simplified schematic cross-sectional view illustrating an example of a conventional electron discharging apparatus.

Next, as shown in FIG. 8E, using the lithographic and etching techniques, a second aperture 25 is formed by way of etching the protecting film 44 and the third insulating film 41. Next, the protecting film 44 and the third insulating film 41 buried in the first aperture 24 are respectively removed to cause the first aperture 24 to be opened over again.

Further, using the lithographic and etching techniques, another aperture 45 used for wire-bonding and connecting to the extraction electrode 32 is formed through the protecting film 44. Next, the first aperture 24 is extended to the first insulating film 21 to cause the pn-junction 15 to be exposed. As a result, another aperture 26 is formed on the pn-junction 15 corresponding to the electron discharging portion consisting of the first aperture 24 and the second aperture 25. Further, while executing the above-referred etching process, it is also allowable to laterally etch the first insulating film 21 from the side of the first aperture 24 to cause the accelerating electrode 31 to be overhung against the first aperture 24.

In the above fourth manufacturing method, resist mask (not shown) formed via a lithographic technique is removed immediately after completing an ion implantation process or an etching process. Further, it is desired that barrier metal (not shown) be disposed below the extraction electrodes 32 and 33.

In the above-referred fourth manufacturing method, initially, a side-wall electrode 36 connecting to an electrode film 35 of the lateral wall of an aperture 26 corresponding to the first aperture 24 is formed, and then, an accelerating electrode 31 is formed by means of the electrode film 35 and the side-wall electrode 36. Accordingly, the accelerating electrode 31 is formed into a substantially inverse L-shaped configuration. And yet, inasmuch as the side-wall electrode 36 is formed by way of facing the first aperture 24, the accelerating electrode 31 is provided with a greater exposure area with respect to the electron discharging portion consisting of a pn-junction 15 than that of such an accelerating electrode provided for any of conventional electron discharging apparatuses. Because of this, the accelerating electrode 31 may fully accelerate electrons emitted from the pn-junction 15.

As a result of forming the accelerating electrode 31 composed of electrically conductive polycrystalline silicon as was described in the above practical aspects for implementing the present invention, inasmuch as sufficient cross-sectional area assumable against the pn-junction 15 for constituting the electron discharging portion can be secured, by way of adding a proper voltage to the accelerating electrode 31, electrons emitted from the pn-junction 15 can effectively be accelerated.

The above-referred aperture 26 of the accelerating electrode 31 may be disposed so as to surround the electron discharging portion, i.e., the pn-junction 15, via an insulating film. The electron discharging portion may be formed into a circular shape, or a rectangular shape, or other polygonal shapes, or an elliptic shape, for example.

As is apparent from the above description, according to the first electron discharging apparatus related to the present invention, inasmuch as an inventive accelerating electrode is formed by way of projecting itself into an aperture portion, a lateral surface and the bottom surface of the accelerating electrode are respectively exposed against the aperture portion. Accordingly, the accelerating electrode is provided with a greater exposure area with respect to the electron discharging portion consisting of a pn-junction than that of such an accelerating electrode provided for any of conventional electron discharging apparatuses. Because of this, it is possible to efficiently and fully accelerate hot electrons emitted from the pn-junction via avalanche effect.

According to the second electron discharging apparatus related to the present invention, inasmuch as an inventive accelerating electrode is formed into a substantially L-shaped configuration at a cross-sectional plane, by way of forming the substantially L-shaped vertical-wall portion of the accelerating electrode facing an aperture portion, the accelerating electrode is provided with a greater exposure area with respect to the electron discharging portion consisting of a pn-junction than that of such an accelerating electrode provided for any of conventional electron discharging apparatuses. As a result, it is possible to efficiently and fully accelerate hot electrons emitted from the pn-junction via avalanche effect.

According to the third electron discharging apparatus related to the present invention, inasmuch as an inventive accelerating electrode is formed into a substantially inverse L-shaped configuration at a cross-sectional plane, by way of forming the substantially inverse L-shaped vertical-wall portion of the accelerating electrode facing an aperture portion, the accelerating electrode is provided with a greater exposure area with respect to the electron discharging portion consisting of a pn-junction than that of such an accelerating electrode provided for any of conventional electron discharging apparatuses. As a result, it is possible to efficiently and fully accelerate hot electrons emitted from the pn-junction via avalanche effect.

According to the first method for manufacturing the electron discharging apparatus related to the present invention, inasmuch as an inventive accelerating electrode is formed by way of projecting itself into an aperture portion after removing insulating films on the part of an aperture portion below the accelerating electrode, it is possible to form the lateral surface and the bottom surface of the accelerating electrode in the state being exposed to the aperture portion. As a result, the accelerating electrode is provided with a greater exposure area with respect to the electron discharging portion consisting of a pn-junction than that of such an accelerating electrode provided for any of conventional electron discharging apparatuses. Because of this, it is possible to form such an accelerating electrode capable of fully accelerating hot electrons emitted from the pn-junction.

According to the second method for manufacturing the electron discharging apparatus related to the present invention, inasmuch as an inventive accelerating electrode is formed by means of an electrode film and a side-wall electrode after forming the side-wall electrode connecting to said electrode film on a lateral wall of an aperture, the accelerating electrode is formed into a substantially L-shaped configuration at a cross-sectional plane. And yet, inasmuch as the side-wall electrode corresponding to the substantially L-shaped vertical-wall portion is formed by way of facing the aperture side, the accelerating electrode is provided with a greater exposure area with respect to the electron discharging portion consisting of a pn-junction than that of such an accelerating electrode provided for any of conventional electron discharging apparatuses. Because of this, it is possible to form such an accelerating electrode capable of fully accelerating hot electrons emitted from the pn-junction.

According to the third method for manufacturing the electron discharging apparatus related to the present invention, the third manufacturing method comprises a step of forming an electrode film necessary for forming an accelerating electrode by way of fully covering a dummy pattern; a step of initially forming a leveled insulating film on the electrode film; a step of etching back the leveled insulating film; and a step of selectively removing the electrode film formed on said dummy pattern. As a result, the electrode film is formed into a substantially L-shaped configuration at a cross-sectional plane. Further, the third method also comprises a step of forming an aperture portion by removing said dummy pattern, thus enabling to form the substantially L-shaped vertical-wall portion of the accelerating electrode by way of facing the aperture portion side. As a result, the accelerating electrode is provided with a greater exposure area with respect to the electron discharging portion consisting of a pn-junction than that of such an accelerating electrode provided for any of conventional electron discharging apparatuses. Because of this, it is possible to form such an accelerating electrode capable of fully accelerating hot electrons emitted from the pn-junction.

According to the fourth method for manufacturing the electron discharging apparatus related t the present invention, initially, a side-wall electrode connecting to an electrode film is formed on a lateral wall of an aperture portion, and then, an accelerating electrode is formed by means of the electrode film and the side-wall electrode. As a result, it is possible to form the accelerating electrode into a substantially inverse L-shaped configuration at a cross-sectional plane. And yet, inasmuch as the side-wall electrode corresponding to the substantially inverse L-shaped vertical-wall portion is formed by way of facing the aperture portion side, the accelerating electrode is provided with a greater exposure area with respect to the electron discharging portion consisting of a pn-junction than that of such an accelerating electrode provided for any of conventional electron discharging apparatuses. Because of this, it is possible to form such an accelerating electrode capable of fully accelerating hot electrons emitted from the pn-junction.

What is claimed is:

1. An electron discharging apparatus comprising;

a pn-junction formed on a surface side of a semiconductor substrate;

an insulating film, having a first insulating film and a second insulating film formed in said first insulating film, formed on said semiconductor substrate, and a third insulating film;

an aperture portion, having a first aperture portion formed through said insulating film, and a second aperture portion, together formed on said pn-junction, said first aperture portion and said second aperture portions constituting an electron discharging portion from each; and an accelerating electrode formed between said second insulating film of said insulating film and said third insulating film so as to surround a periphery of said first aperture portion and projecting toward a center of said aperture portion;

wherein said accelerating electrode is formed so as to project its inner edge portion into said first aperture portion, overhanging in the first aperture portion so that the edge portion and a bottom surface of the accelerating electrode project themselves toward said first aperture portion, and a top surface thereof projects itself toward said second aperture portion.

2. The electron discharging apparatus as set forth in claim 1 wherein edges of said first aperture portion and said second aperture portion on said pn junction side are substantially in alignment.

3. The electron discharging apparatus as set forth in claim 1 wherein edges of said first aperture portion extend further away from said pn junction by over-etching than a corresponding edge of said second aperture portion.

4. An electron discharging apparatus comprising;

a pn-junction formed on a surface side of a semiconductor substrate;

an insulating film formed on said semiconductor substrate;

an aperture portion formed through said insulating film on said pn-junction; and an accelerating electrode formed on said insulating film so as to surround a periphery of said aperture portion;

wherein said accelerating electrode is formed into a substantially L-shaped configuration at a cross-sectional plane.

5. An electron discharging apparatus comprising;

a pn-junction formed on a surface side of a semiconductor substrate;

an insulating film formed on said semiconductor substrate;

an aperture portion formed through said insulation film formed on said pn-junction; and an accelerating electrode formed on said insulating film so as to periphery of said aperture portion; wherein said accelerating electrode is formed into a substantially inverse L-shaped configuration.

* * * * *

UNITED STATES PATENT AND TRADEMARK OFFICE

CERTIFICATE OF CORRECTION

PATENT NO. : 6,441,390 B2 
DATED : August 27, 2002
INVENTOR(S) : Junichi Sato et al.

It is certified that error appears in the above-identified patent and that said Letters Patent is hereby corrected as shown below:

Title page,
Item [57], ABSTRACT,
Line 13, after the word "that" add -- the --.

Column 20,
Lines 37 and 41, replace "pn junction" with -- pn-junction --.
Line 63, after the word "to" add -- surround a --.

Signed and Sealed this

Seventeenth Day of June, 2003

JAMES E. ROGAN
*Director of the United States Patent and Trademark Office*